United States Patent [19]

Friede et al.

[11] Patent Number: 5,418,378
[45] Date of Patent: May 23, 1995

[54] ION IMPLANT DEVICE WITH MODULATED SCAN OUTPUT

[75] Inventors: Donald L. Friede; Van Le; Denver L. Dolman, all of Austin, Tex.

[73] Assignee: Advanced Micro Devices, Sunnyvale, Calif.

[21] Appl. No.: 212,247

[22] Filed: Mar. 14, 1994

[51] Int. Cl.⁶ .......................................... H01J 37/302
[52] U.S. Cl. ..................... 250/492.21; 250/492.3; 250/398
[58] Field of Search ............... 250/396 R, 398, 492.1, 250/492.2, 492.21, 492.3

[56] References Cited

U.S. PATENT DOCUMENTS

| | | | |
|---|---|---|---|
| 3,688,203 | 8/1972 | Harrison | 250/398 |
| 4,449,051 | 5/1984 | Berkowitz | 250/492.21 |
| 4,736,107 | 4/1988 | Myron | 250/492.21 |
| 4,746,803 | 5/1988 | Inoue et al. | 250/396 R |
| 4,761,559 | 8/1988 | Myron | 250/492.21 |
| 4,851,693 | 7/1989 | Fisher | 250/492.21 |
| 5,012,111 | 4/1991 | Ueda | 250/492.21 |

*Primary Examiner*—Jack I. Berman
*Assistant Examiner*—James Beyer
*Attorney, Agent, or Firm*—Conley, Rose & Tayon

[57] ABSTRACT

An ion implanter is provided having a modulator which provides a variable frequency modulated scan signal. The modulator ensures that the scan signal will not retrace substantially upon itself during a scan cycle, and during subsequent scan cycles. Minimization of retrace allows for a more uniform dopant placed across the upper surface of the wafer and thereby eliminates or minimizes underdoping areas often arising between retraced beam widths when heavy atomic species are implanted.

20 Claims, 3 Drawing Sheets

ION IMPLANT DEVICE WITH MODULATED SCAN OUTPUT

BACKGROUND OF THE INVENTION

1. Field of the Invention

This invention relates to semiconductor manufacture and more particularly to a device and method for implanting a substantially uniform dosage of ions across a semiconductor wafer.

2. Background of the Relevant Art

Ion implantation devices, or ion implanters, are well known. A primary function of an ion implanter is to provide an ion beam with sufficient energy to penetrate into a solid surface. Ion implanters are commonly used in the semiconductor industry to introduce impurities or dopants into the solid substrate material. The depth in which ions are introduced into the substrate increases as acceleration voltage of the implanter increases. Moreover, the total number of ions injected is proportional to the beam current and implant time of the implanter.

Due to the growing popularity of high density VLSI circuits, medium to low current implanters have become a mainstay in integrated circuit manufacture. It is important when implanting impurities that the impurities be placed at a fairly shallow distance into the substrate. As such, the impurities form a shallow junction necessary for enhanced performance of high density circuits. Medium to low current implanters are generally characterized as implanters having beam currents generally less than 10 $\mu$A. A typical medium current implanter 10 is shown in FIG. 1. Implanter 10 generally includes an ion source 12, a target area 14, and an ion beam 16 conditioned between source 12 and target 14. Placed within the path of ion beam 16 are numerous conditioning elements. In particular, a mass analyzer 18 is used to filter or select various ion species based on the charge-to-mass ratio of the extracted ions. Analyzer 18 is generally sensitive enough to discriminate against adjacent mass numbers. The ions are then given a final acceleration from a resolving aperture 20 via an acceleration tube 22. The accelerated ions produced at the output of tube 22 are then focused to a fairly close or "tight" beam width via lens 24. The focused beam can them be deflected by x- and y-deflector plates 26 and 28, respectively. X- and y-deflector plates receive modulated voltage so as to scan the focused ion beam 16 in the x and y directions, respectively, across a wafer placed within target area 14.

Ion beam 16 is focused and deflected by plates 26 and 28 in the same manner as electron beams are deflected in electron microscopy. Ion beam lens 24 and plates 26 and 28 function by electrostatically shaping an electron or magnetic field thereby causing a resulting effect upon the charged ion beam. Beam 16 is focused at a specific beam width of ions impinging across select areas of a semiconductor wafer. The methodology by which beam 16 is electrostatically controlled in a specific scan pattern across a wafer is herein described below.

Referring to FIG. 2, lens 24 can be made from a pair of hollow-tube, electrostatically charged cylinders 30a and 30b. Cylinders 30a and 30b have electrical energy applied to them to focus or converge an ion source of beams 16 along a central axis 32. Unfortunately, depending upon the relative atomic mass of the ion species being accelerated, varying amounts of convergence is achieved. For example, lighter boron ions may be more easily converged along axis 32 than heavier phosphorous ions, provided the amount of charge on cylinders 30a and 30b remains fixed. However, lighter boron ions have a greater tendency to diverge downstream of lens 24. The lighter boron ions are more susceptible to extraneous electric or magnetic fields which can pull the ions from a tightly focused beam width.

Referring to FIG. 3, the effects of extraneous electrical and magnetic fields upon the beam width, between lens 24 and target 14, is illustrated as a function of atomic mass of the ion species. A heavy atomic species 34 often maintains a tighter beam width, $BW_{EFF}$, than a light atomic species 36. As such, beam size (i.e., beam width or beam diameter) is a function of relative atomic mass of the species being accelerated. During semiconductor manufacture, the operator must be cognizant of the atomic species in order to ensure that the resulting beam width scans in a uniform fashion across the entire wafer surface. If the beam width is more narrow, as is often the case in heavier atomic species, then the scanned pattern must be changed accordingly. Otherwise, there may be "gaps" between adjacent beam width scan lines. The gaps can lead to areas of under-dosage upon the wafer.

FIG. 4 illustrates the "gaping" problem which may arise if the ion implanter is not adjusted to compensate for smaller beam widths, $BW_{EFF}$, attributed to larger atomic mass species. Gap 40 is shown to occur on wafer 42, between adjacent scan lines 44a and 44b. Gap area 40 receives insufficient amounts of ion implant thereby causing, for example, relative increase in thresholds of active devices patterned within area 40.

As shown in FIG. 4, ion beam 16 is scanned across wafer 42 in both the x and y directions. Scanning occurs by modulating voltage on both the x and y deflector plates 26 and 28, shown in FIG. 1, so as to move the ion beam in a positive x and y direction followed by a negative x and y direction, thereby completing an entire scan cycle. To further illustrate, a "scan cycle" is the scanning of an ion beam completely across the wafer and then rescanning the ion beam back across the wafer. The scan cycle includes movement of the beam in a specific pattern, in accordance with the signal frequency placed upon the deflectors. The pattern maintains or repeats itself throughout the entire scan cycle causing a property often referred to as "retrace".

Retrace involves movement of the ion beam during one half a scan cycle across wafer 42 and then moving the ion beam in the very same pattern back across wafer 42. The retrace pattern involved in the second half of the scan cycle is the same ion beam pattern placed upon wafer 42 during the first half of the scan cycle. Thus, if there is any gap 40 between beam widths, the retrace pattern will not "fill" the gap and thus cannot prevent non-uniform dopant placed across wafer 42. Knowing the importance of uniform doping, it is therefore advantageous to provide a scan pattern which would ensure there would be no gaps upon wafer 42 during times in which ion source 12 undergoes a change in source material having a heavier atomic mass. It is further advantageous that the shape of the beam be irrelevant to the uniformity of the dopant placed across the wafer.

SUMMARY OF THE INVENTION

The problems outlined above are in large part solved by an ion implant device which can provide uniform dosage of ions across an entire semiconductor wafer, regardless of relative changes in atomic mass of species placed within the ion source of the implanter. That is, the implant device and method hereof purposefully modulates the scan lines in order that the scan pattern not "retrace" upon itself thereby leaving gaps of underdosage within the wafer. The scan pattern is frequency modulated in the x direction in order to ensure the scan frequency of signals upon the x-deflectors change during a scan cycle. Change in scan frequency allows the point of impingement of the beam upon the wafer to continuously changes in proportion to that frequency such that, during a plurality of scans across the wafer, retrace of impingement of the ion beams upon the wafer is substantially minimized. By minimizing or substantially eliminating retrace problems, regardless of the atomic species used at the ion source, the operator need not continually adjust the implanter in order to compensate for varying atomic species. Accordingly, the operator need not continuously change output current in an attempt to maintain fairly consistent beam width. The modulating signal is automatically input upon the x-deflector during operation of the implant. Thus, the modulating signal will ensure minimum retrace and substantially uniform dopant placed across the wafer throughout each scan cycle regardless of the species being loaded.

Broadly speaking, the present invention contemplates an ion implanter. The implanter includes an oscillator adapted for providing a fixed frequency y signal. The implanter further includes a modulator adapted for providing a variable frequency x signal. A scan amplifier is coupled to receive output from the oscillator and modulator. The scan amplifier is adapted for buffering and phase modulating the y signal into two y scan signals of opposite phase from each other and for buffering and phase modulating the x signal into two x scan signals of opposite phase from each other. A pair of x-deflectors is connected to the output of the scan amplifier to receive x scan signals and a pair of y-deflectors is connected to the output of the scan amplifier to receive y scan signals.

The modulator includes first and second waveform generators connected in series. The second waveform generator comprises an input and an output. The input receives a triangular wave of fixed frequency and the output produces the x signal having a frequency which varies in direct proportion to changes in voltage of the triangular wave. The x signal, converted to a pair of x scan signals placed upon the deflectors, provides frequency modulated movement of the ion beam across the wafer such that, during a plurality of scans (or scan cycles) across the wafer, retrace of impingement of the ion beam upon the wafer is substantially minimized.

The present invention further contemplates a method for implanting an ion beam across the wafer. The method comprises the steps of providing a beam of ions extending from an ion source to a semiconductor wafer. A pair of x-deflectors and a pair of y-deflectors are further provided and arranged about the beam of ions. The beam of ions is moved at a regular periodic rate across the wafer in a y direction by applying a pair of y scan signals to the y-deflectors. The beam of ions is simultaneously moved at an irregular periodic rate across the wafer by applying a pair of x scan signals to the x-deflectors. Each of the x scan signals is modulated such that, during a plurality of scan movements across the wafer, retrace of impingement of the ion beam upon the wafer is substantially minimized. The x scan signals are synchronized with and are 180° out of phase with each other. Likewise, the y scan signals are synchronized with and 180° out of phase with each other. Moreover, the x and y directions are substantially perpendicular to each other.

BRIEF DESCRIPTION OF THE DRAWINGS

Other objects and advantages of the invention will become apparent upon reading the following detailed description and upon reference to accompanying drawings in which.

Figure 1:
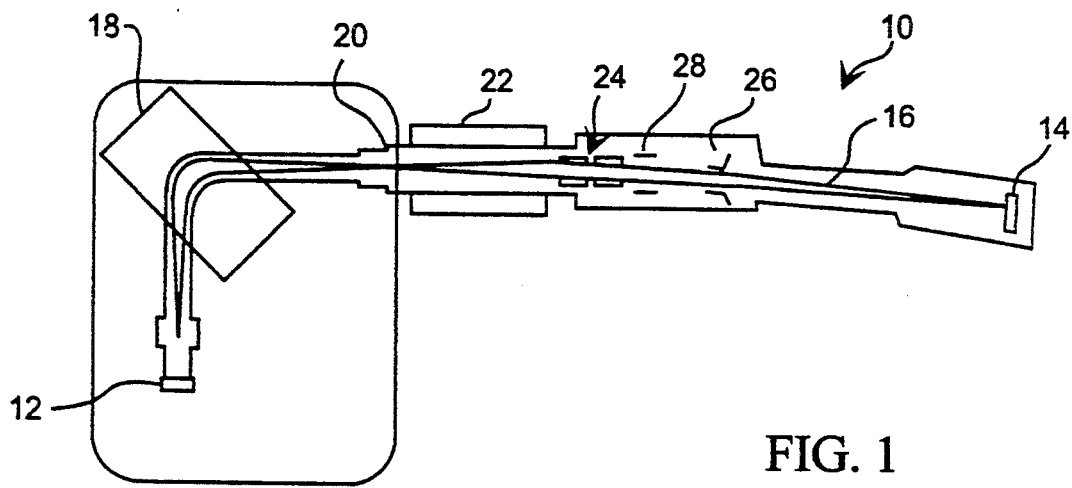
FIG. 1 is a plan view of an ion implanter.
Figure 2:
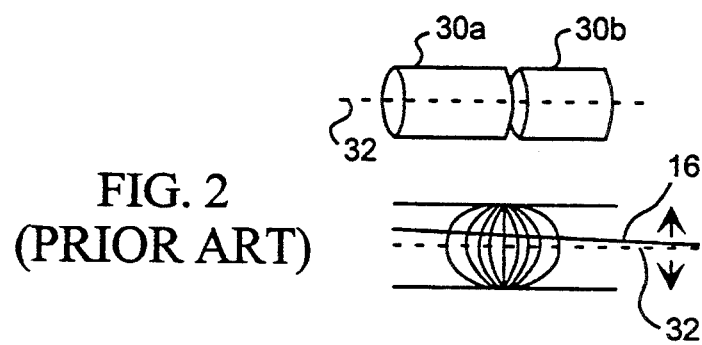
FIG. 2 is a perspective view of a hollow tube, cylindrical ion beam lens and a cross-sectional view of an ion beam path resulting from said lens.
Figure 3:
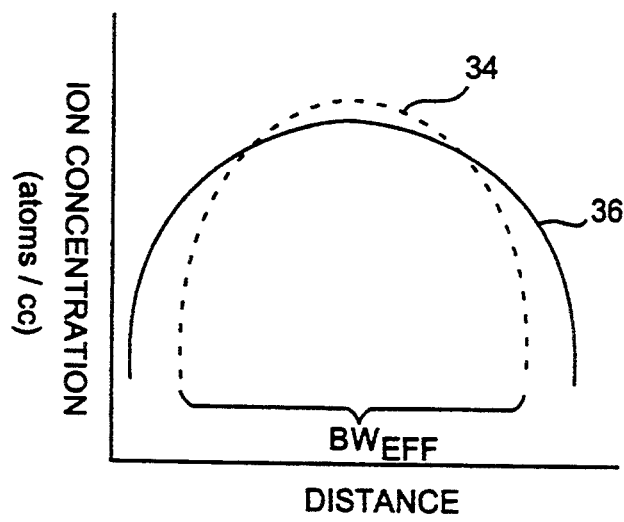
FIG. 3 is a graph of beam width as a function of ion concentration for species of dissimilar atomic mass.
Figure 4:
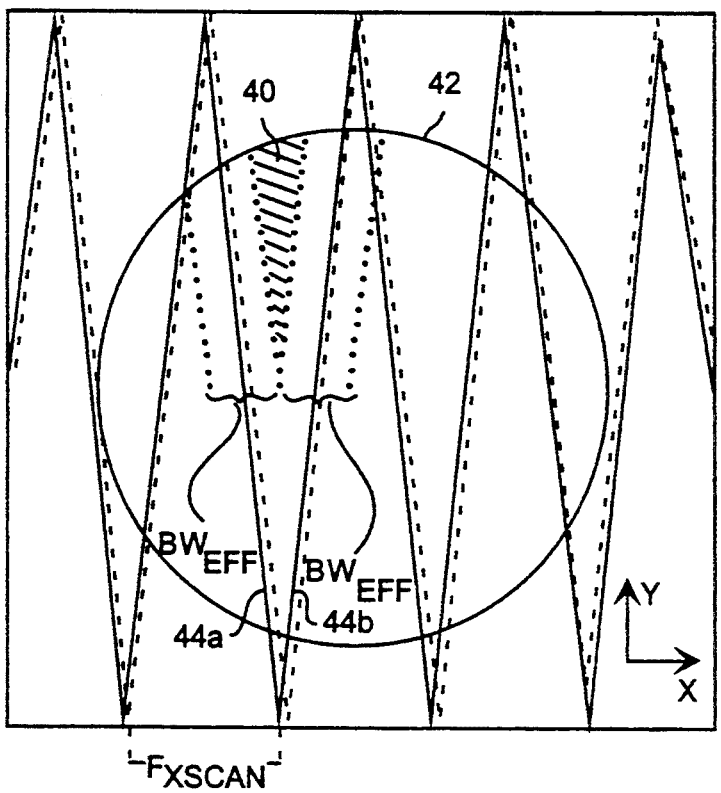
FIG. 4 is a beam pattern of a scan cycle across a wafer according to a prior design.

While the invention is susceptible to various modifications and alternative forms, specific embodiments thereof are shown by way of example in the drawings and will herein be described in detail. It should be understood, however, that the drawings and description thereto are not intended to limit the invention to the particular forms disclosed, but on the contrary, the intention is to cover all modifications, equivalents and alternatives falling within the spirit and scope of the present invention as defined by the appended claims.

DETAILED DESCRIPTION OF THE INVENTION

Figure 5:
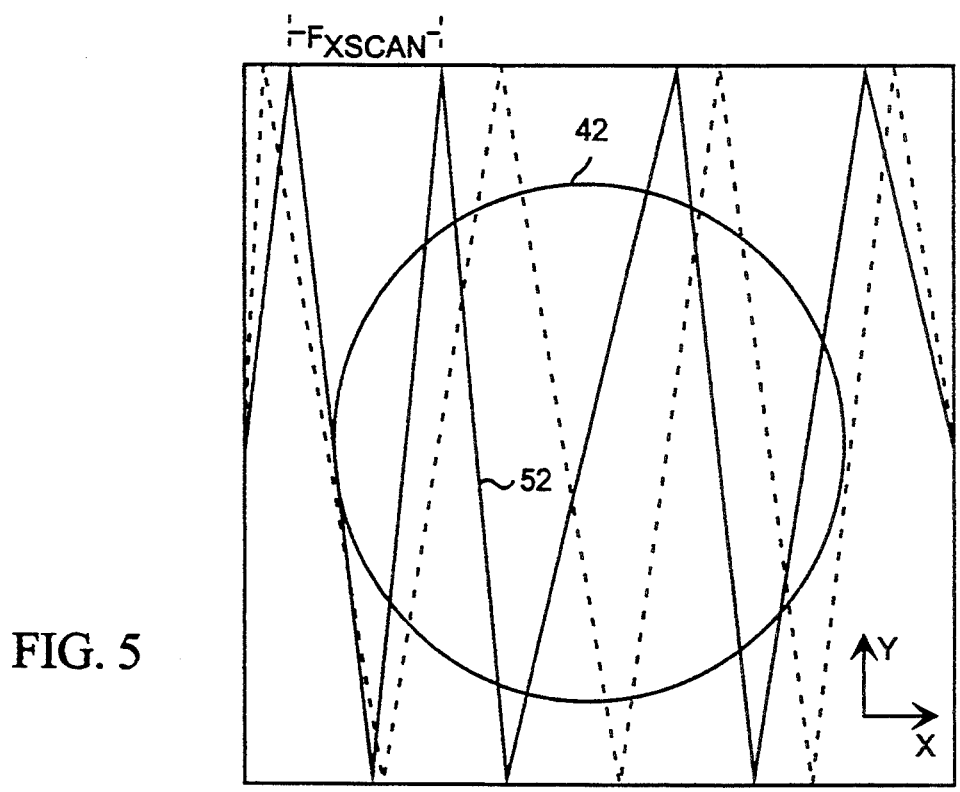
FIG. 5 is a beam pattern of a scan cycle across a wafer according to the present invention.

Turning now to the drawings, FIG. 5 illustrates a beam pattern placed across semiconductor wafer 42 shown according to the present invention. Beam pattern comprises a scan cycle (i.e., a scan of an ion beam across the wafer in a positive x direction and then back across the wafer in a negative x direction. The scan cycle also pertains to scan in a positive y direction followed by a scan in a negative y direction. Scan cycle and beam pattern are terms well known in the art. For the sake of clarity, only a single scan cycle is shown. However, it is understood that numerous scan cycles occur during the implant stage of an impurity into wafer 42. Thus, to implant wafer 42, the y-deflectors are charged with triangular waveforms which alternate in polarity (phase) during each one-half scan cycle, and the y-deflector triangular waveforms are shown to occur at a higher frequency than the x-deflector pulses. For example, an increasing waveform (triangular wave) followed by a decreasing waveform (triangular wave) on one x-deflector and an opposite "polarity" decreasing and increasing waveforms, respectively, on the other x-deflector causes an entire scan cycle in the x direction. Simultaneous with the x scan cycle are numerous y scan cycles, each cycle represented by an increasing and decreasing waveform on one y-deflector and an opposite "polarity" decreasing and increasing waveform, respectively, placed on the other y-deflector.

The x-deflector waveform and y-deflector waveform comprise a signal which is defined herein as x scan signal and y scan signal, respectively. Opposite polarities for both the x- and y-deflectors are achieved by reversing the phase between a pair of x scan signals and reversing the phase between a pair of y scan signals. FIG. 5 illustrates a y scan signal having a substantially fixed frequency. The y scan signal (one being of opposite polarity than the other) placed on the y-deflectors causes movement of the ion beam in the y direction. Advantageously, x scan signals (one being of opposite polarity than the other) placed on the x-deflectors causes ion beam movement in the x direction. The y scan signal frequency is substantially higher than the x scan frequency. Moreover, the x scan frequency is purposefully modulated to a variable frequency so as to minimize or substantially reduce the retraced problem, and the occurrence of gaps between ion beams often encountered in prior designs which do not modulate or vary the x or y scan signal frequency.

By modulating the x scan signal frequency, ion beam 52 is assured of being placed in a dissimilar position from its previous placement on wafer 42 (the previous placement occurring during previous scan cycles or during a previous portion of the current scan cycle). Thus, by modulating the x scan signal frequency and maintaining the y scan frequency fixed, the current implantation technique ensures a more uniform placement of dopant across wafer 42, regardless of ion species, corresponding beam width, and/or implanter beam current.

Figure 6:
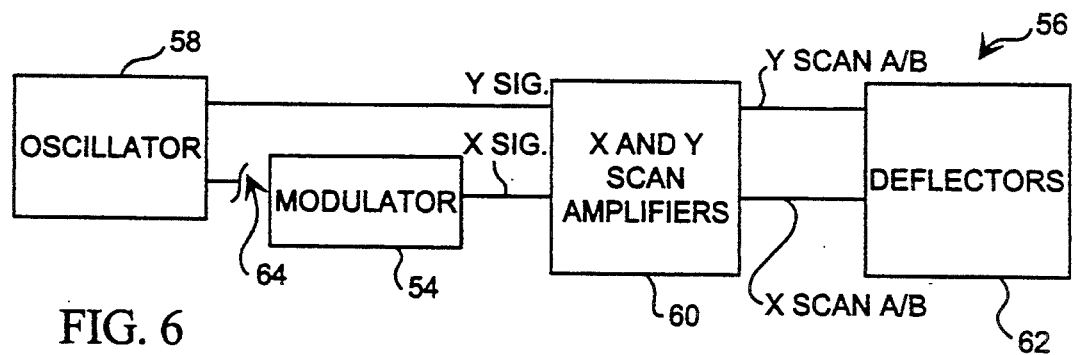
FIG. 6 is a block diagram of an ion implanter according to the present invention.

In order to effectuate modulated x scan signal frequency of varying frequency magnitude, a modulator may be utilized, such as modulator 54 shown in FIG. 6. Referring to FIG. 6, a block diagram of an ion implanter 56 is shown. Ion implanter 56 includes an oscillator 58, x and y scan amplifiers 60, deflectors 62, as well as modulator 54. Oscillator 58 includes any circuit necessary to achieve a fixed frequency, square-wave signal, referred to in FIG. 6 as y signal. Oscillator 58, amplifiers 60 and deflectors 62 are often found in existing medium current ion implanters, such as the medium current implanter, model 3204-3206, manufactured by Eaton-Kasper Corp., of Austin, Tex. Instead of using the modulating signal normally sent to amplifiers 60 of a conventional medium current implanter, the signal can be discontinued and modulator 54 can thereby provide the necessary signal. Modulator 54 produces a variable frequency x signal to achieve the frequency modulating advantages shown in FIG. 5.

The x and y signals are amplified and phase modulated to produce buffered signals, referred to as x and y scan signals. The x scan signals are 180° out of phase with each other, and the y scan signals are 180° out of phase with each other. Thus, one phase of x scan signal is denoted as x scan A, while the other phase of x scan signal is denoted as x scan B. Similar denotation is provided for y scan A and y scan B, the references for x and y scan A/B are used further herein below. Given opposite phase for both the x and y scan signals, deflectors 62 respond by moving the ion beam across the wafer during one-half a scan cycle and then, after polarity reverses, moving the beam back across the wafer during the latter half of the scan cycle. Amplification and phase modulation, as well as deflector response thereto, is further described in reference to FIG. 7.

Figure 7:
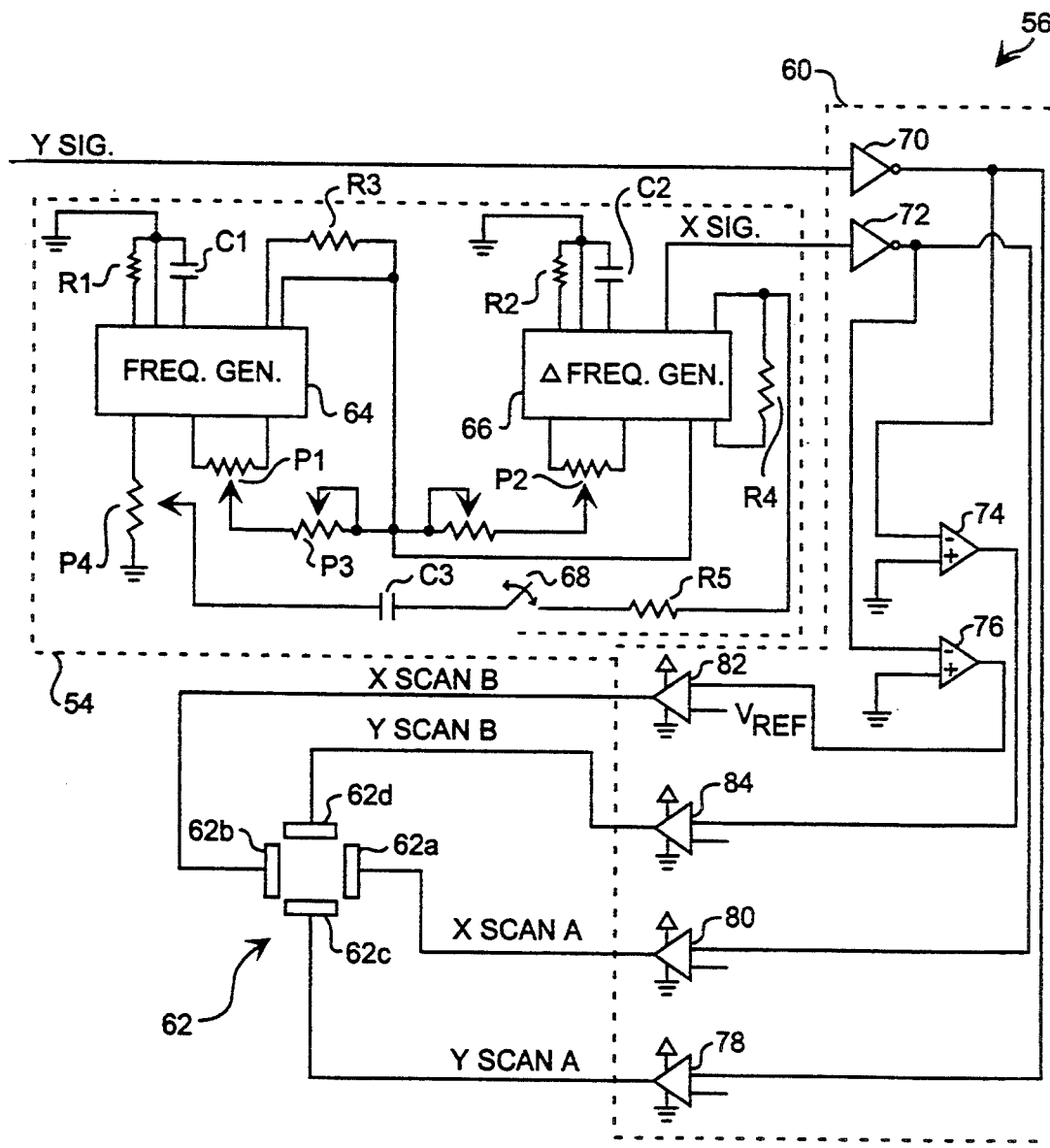
FIG. 7 is a circuit schematic of a portion of an ion implanter according to the present invention.

Referring to FIG. 7, a circuit schematic of a portion of ion implanter 56 is shown. In particular, amplifiers 60 are shown coupled between modulator 54 and deflectors 62. For sake of clarity, many circuit components, all of which would be well known to those skilled in the art, are omitted from amplifiers 60 and deflectors 62.

Various circuit components are well defined and publicly documented within the manuals attributed to, for example, the Kasper medium current ion implanter, manufactured by Eaton-Kasper Corp. of Austin, Tex. The main functional elements and components are, however, described to lend insight as to the particular operational features of amplifier 60 and deflectors 62, as they pertain to the operation of and connectivity to modulator 54.

Modulator 54 includes a pair of waveform generators. The first waveform generator, or frequency generator 64 is connected in series with a second waveform generator, or $\Delta$ frequency modulator 66. Frequency generator 64 and $\Delta$ frequency modulator 66 are precision waveform generators capable of producing triangular waveforms with a minimum number of external components. Frequency generator 64 and $\Delta$ frequency modulator 66 are each obtainable as a single monolithic circuit from Exar Corporation, San Jose, Calif., Part No. XR-8038. Frequency generator 64 and $\Delta$ frequency modulator 66 include many external connections such as capacitors C1 and C2 connected to pin 10, as well as resistors R1 and R2 connected to pin 12 to exemplary Part No. XR-8038. Still further, potentiometers P1 and P2 are connected between pins 4 and 5 of the exemplary part. Suitable values for C1, C2, R1, R2, P1 and P2 are, respectively, 4.7 $\mu f$, 0.1 $\mu f$, 82.0 k$\Omega$, 82.0 k$\Omega$, 1 k$\Omega$ and 20 k$\Omega$. Connected between the square wave output pin 9 of frequency generator 64 and pin 6 of said generator is resistor R3. An exemplary value for resistor R3 is 8.2 k$\Omega$. Pins 7 and 8 of generator 64 are connected together while pins 7 and 8 modulator 66 are connected via a resistor R4. An exemplary value for resistor R4 is 15 k$\Omega$. Connection of resistor R3 to potentiometer P3, an exemplary value of which is approximately 100 k$\Omega$, provides frequency modulation to duty cycle adjust pins 4 and 5 of generator 64. Potentiometer P3, as well as potentiometer P1, allows adjustment in output frequency appearing upon potentiometer P4, a suitable value of which is 2 k$\Omega$. Adjustment in potentiometer P4 provides variability in the output gain of a triangular wave. The triangular wave is DC filtered (i.e., DC component of the triangular wave is blocked) by capacitor C3, a suitable value of which is approximately 10 $\mu f$. A triangular wave input component to capacitor C3 is then fed to series-connected FM sweep input of modulator 66 via resistor R5. An exemplary value for resistor R5 is 10 k$\Omega$. Triangular wave upon FM sweep input, the frequency, the gain and duty cycle of the triangular wave being adjustable by potentiometers P1, P3 and P4, provides a modulating signal to modulator 66. Potentiometer P2 is adjusted to ensure the triangular waveform output is balanced—i.e., increasing portion of the waveform occurs within a time duration identical to the time duration of the decreasing portion. The frequency of triangular wave through resistor R5 causes a variable DC voltage at the input pin (FM sweep pin) to modulator 66. Frequency increase at the output of modulator 66 results from a decrease in the FM sweep input pin input voltage from the upper limit to its lower limit. The resulting modulator frequency output is presented as the x signal forwarded from modulator 54 to amplifiers 60, as shown.

Accordingly, the triangular output wave from generator 64 is fixed in frequency, wherein the triangular wave is sent to FM sweep input of modulator 66 so as to produce the x signal having a frequency which varies in direct proportion to changes in the voltage of the fixed frequency triangular wave. Thus, series connection of generator 64 with modulator 66 produces a frequency modulated x signal from the output of modulator 54. Modulator 54 can be deactivated by opening a switch 68. Once deactivated, the operator, if desired, can reconnect severed input 64 so as to present a non-modulated x signal to amplifiers 60. Accordingly, switch 68 provides quick activation or deactivation of the modulating circuit and methodology hereof.

X and y scan amplifiers 60 are adapted to receive a fixed frequency y signal and variable (modulated) frequency x signal. Amplifiers 60 amplify or buffer the corresponding signals by buffers/invertors 70 and 72. Before receiving x and y signals, an intermediate frequency divider may be coupled before buffers 70 and 72. Frequency dividers are often used in implanter circuitry to count pulse signals of x and y signals and provide, based on that count, one-half, one-fourth, etc. the frequency of the original x and y signals. Frequency dividers are often achieved by connecting the Q output to the D input, and feeding the clock input via the x and y signals. Depending upon the number of stages of D-type flip-flops arranged in series, numerous divisions of the initial x and y signals can be achieved. For sake of clarity, frequency dividers are not shown in FIG. 7. However, it is understood that x and y signals can be of any frequency necessary to achieve a desired scan cycle across the wafer, and that the initial oscillator frequency can be frequency divided, if desired.

At the output of buffers 70 and 72 are a pair of corresponding operational amplifiers 74 and 76 as well as a pair of power amplifiers 78 and 80. Operational amplifiers 74 and 76 provide phase modulation of the output signal from buffers 70 and 72. Phase modulation is achieved by routing the output of buffers 70 and 72 into the inverting inputs of amplifiers 74 and 76. A corresponding output of opposite polarity (180° out of phase with the input signal) is achieved and routed to corresponding power amplifiers 82 and 84. A suitable operational amplifier 74 and 76 can be obtained from Motorolla Semiconductor, Inc., Schaumberg, Ill., Part No. LF411. Moreover, suitable power amplifiers 78, 80, 82 and 84 can be obtained from those present within an Eaton-Kasper medium current ion implanter, model No. 3204-3206.

As shown in FIG. 7, output from power amplifiers 78-84 provide scan signals x scan A/B and y scan A/B. X scan A signal is of the same amplitude and frequency as x scan B, but of opposite phase or polarity. Likewise, y scan A is of the same frequency and amplitude as y scan B, but of opposite phase or polarity. Thus, x-deflectors 62a and b as well as y-deflectors 62c and d, receive corresponding scan signals of control amplitude, frequency and phase. Deflectors 62a-d are arranged around the logitudinal axis through which an ion beam extends. Depending upon the amount of voltage at each deflector, and the polarity of that voltage, the ion beam will be deflected toward or away from the respective electrostatically charged deflector. Proper timing of voltages upon corresponding deflectors provides a pattern of ion beams which extend across a wafer according to the illustration of FIG. 5.

It will be appreciated to those skilled in the art having the benefit of this disclosure that this invention is believed to be capable of applications with numerous types of ion implanters. Various types of ion implanters can be retrofitted to include a modulator circuit necessary for frequency modulating an x scan signal placed upon x-deflectors. The x-deflectors are arranged perpendicular to y-deflectors and represent a particular orientation in which the ion beam is directed across the wafer, i.e., perpendicular to the direction in which ion beams are forwarded in response to y-deflector activation. It is also to be understood that the form of the invention shown and described is to be taken as an exemplary presently preferred embodiment. Various modifications and changes may be made without departing from the spirit and scope of the invention as set forth in the claims. An exemplary modification might be one which uses other arrangements of frequency generators or a frequency modulators other than those shown and described. Provided the modulation of x signal is achieved, any configuration which produces the stated function, as understood by those skilled in the art after having the benefit of this disclosure, falls within the spirit and scope of the present invention as defined by the following claims.

What is claimed is:

1. An ion implanter, comprising:
   an oscillator adapted for providing a fixed frequency y signal;
   a modulator adapted for providing a variable frequency x signal;
   a scan amplifier adapted for buffering and phase modulating said y signal into two y scan signals of opposite phase from each other and for buffering and phase modulating said x signal into two x scan signals of opposite phase from each other; and
   a pair of x deflectors connected to receive respective said x scan signals and a pair of y-deflectors are connected to receive respective said y scan signals.

2. The ion implanter as recited in claim 1, wherein said variable frequency x signal comprises a maximum frequency value substantially less than the frequency of said fixed frequency y signal.

3. The ion implanter as recited in claim 1, wherein said variable frequency x signal comprises a frequency range of approximately 50 Hz to 150 Hz.

4. The ion implanter as recited in claim 1, wherein said fixed frequency y signal comprises a frequency of approximately 4 KHz.

5. The ion implanter as recited in claim 1, wherein said modulator comprises:
   first and second waveform generators connected in series; and
   said second waveform generator comprises an input and an output, wherein said input receives a triangular wave of fixed frequency and said output produces said x signal having a frequency which varies in direct proportion to changes in voltage of said triangular wave.

6. The ion implanter as recited in claim 5, further comprising a potentiometer coupled to said first waveform generator for adjusting the gain and duty cycle of said triangular wave.

7. The ion implanter as recited in claim 5, wherein the frequency of said x signal increases during increase in DC voltage of said triangular wave, and the frequency of said x signal decreases during decrease in DC voltage of said triangular wave.

8. The ion implanter as recited in claim 1, wherein said x-deflectors and said y-deflectors are arranged within an ion implanter about an ion beam focused from an ion source to a semiconductor wafer such that said x scan signal placed upon said x-deflectors cause modulation of said ion beam across said wafer in an x direction and said y scan signal placed upon said y-deflectors cause modulation of said ion beam across said wafer in a y direction.

9. An ion implanter, comprising:
an oscillator adapted for providing a fixed frequency y signal;
a modulator adapted for providing a variable frequency x signal, said modulator comprising:
first and second waveform generators connected in series; and
said second waveform generator comprises an input and an output, wherein said input receives a triangular wave of fixed frequency and said output produces said x signal having a frequency which varies in direct proportion to changes in voltage of said triangular wave;
a scan amplifier adapted for buffering and phase modulating said y signal into two y scan signals of opposite phase from each other and for buffering and phase modulating said x signal into two x scan signals of opposite phase from each other; and
a pair of x-deflectors and a pair of y-deflectors arranged within an ion implanter about an ion beam focused from an ion source to a semiconductor wafer, wherein said x-deflectors are connected to respective said x scan signals and said y-deflectors are connected to respective said y scan signals, and wherein said x scan signals placed upon said x-deflectors provide frequency modulated movement of said ion beam across said wafer.

10. The ion implanter as recited in claim 9, wherein said variable frequency x signal comprises a maximum frequency value substantially less than the frequency of said fixed frequency y signal.

11. The ion implanter as recited in claim 9, wherein said variable frequency x signal comprises a frequency range of approximately 50 Hz to 150 Hz.

12. The ion implanter as recited in claim 9, wherein said fixed frequency y signal comprises a frequency of approximately 4 KHz.

13. The ion implanter as recited in claim 9, further comprising a potentiometer coupled to said first waveform generator for adjusting the gain and duty cycle of said triangular wave.

14. The ion implanter as recited in claim 9, wherein the frequency of said x signal increases during increase in DC voltage of said triangular wave, and the frequency of said x signal decreases during decrease in DC voltage of said triangular wave.

15. A method for implanting an ion beam across a wafer, comprising the steps of:
providing a beam of ions extending from an ion source to a semiconductor wafer;
providing a pair of x-deflectors and a pair of y-deflectors arranged about said beam of ions;
moving said beam of ions at a regular periodic rate across said wafer in a y direction by applying a pair of y scan signals to said y-deflectors, each y scan signal being 180° out of phase with each other; and
simultaneously moving said beam of ions at an irregular periodic rate across said wafer by applying a pair of x scan signals to said x-deflectors, each said x scan signal being 180° out of phase with each other, and each said x scan signal being modulated such that, during a plurality of scan movements across said wafer, retrace of impingement of said ion beam upon said wafer is substantially minimized.

16. The method as recited in claim 15, wherein said pair of y scan signals are synchronous with each other and said pair of x scan signals are synchronous with each other.

17. The method as recited in claim 15, wherein said moving step comprises scanning said beam of ions in a positive y direction across said wafer during one half a cycle of said y scan signals and subsequently drawing said beam of ions in a negative y direction across said wafer during the other half a cycle of said y scan signals.

18. The method as recited in claim 15, wherein said simultaneously moving step comprises scanning said beam of ions in a positive x direction across said wafer during one half a cycle of said x scan signals and subsequently drawing said beam of ions in a negative x direction across said wafer during the other half of a cycle of said x scan signals.

19. The method as recited in claims 17, wherein said x and y directions are substantially perpendicular to each other.

20. The method as recited in claim 18, wherein said x and y directions are substantially perpendicular to each other.

* * * * *